United States Patent
Miyajima et al.

(10) Patent No.: US 6,686,285 B2
(45) Date of Patent: Feb. 3, 2004

(54) SEMICONDUCTOR DEVICE MANUFACTURE METHOD PREVENTING DISHING AND EROSION DURING CHEMICAL MECHANICAL POLISHING

(75) Inventors: Motoshu Miyajima, Kawasaki (JP); Toshiyuki Karasawa, Kawasaki (JP); Tsutomu Hosoda, Kawasaki (JP); Satoshi Otsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/326,378

(22) Filed: Dec. 23, 2002

(65) Prior Publication Data

US 2003/0228765 A1 Dec. 11, 2003

(30) Foreign Application Priority Data

Jun. 7, 2002 (JP) ........................................ 2002-166621

(51) Int. Cl.$^7$ ..................... H01L 21/311; H01L 21/4763
(52) U.S. Cl. ...................... 438/692; 438/631; 438/633; 438/695; 438/702
(58) Field of Search ................................ 438/631, 633, 438/634, 637, 687, 672, 675, 640, 701, 945, 702, 669, 671, 626, 627, 692, 693, 695

(56) References Cited

U.S. PATENT DOCUMENTS

| | | | | |
|---|---|---|---|---|
| 4,936,950 A | * | 6/1990 | Doan et al. | 438/634 |
| 6,150,272 A | * | 11/2000 | Liu et al. | 438/692 |
| 6,380,003 B1 | * | 4/2002 | Jahnes et al. | 438/131 |
| 6,420,261 B2 | * | 7/2002 | Kudo | 438/633 |
| 6,432,811 B1 | * | 8/2002 | Wong | 438/619 |
| 6,440,840 B1 | * | 8/2002 | Chen | 438/624 |
| 6,448,176 B1 | * | 9/2002 | Grill et al. | 438/637 |
| 6,485,815 B1 | * | 11/2002 | Jeong et al. | 428/210 |
| 6,503,827 B1 | * | 1/2003 | Bombardier et al. | 438/631 |
| 6,515,365 B2 | * | 2/2003 | Higashi et al. | 257/758 |
| 6,524,429 B1 | * | 2/2003 | Nogami et al. | 156/345.11 |
| 6,531,386 B1 | * | 3/2003 | Lim et al. | 438/631 |
| 6,562,725 B2 | * | 5/2003 | Tsai et al. | 438/740 |
| 6,583,047 B2 | * | 6/2003 | Daniels et al. | 438/623 |
| 6,593,250 B2 | * | 7/2003 | Higashi | 438/761 |
| 6,596,581 B2 | * | 7/2003 | Park et al. | 438/253 |
| 6,605,536 B2 | * | 8/2003 | Eissa et al. | 438/687 |
| 6,614,096 B2 | * | 9/2003 | Kojima et al. | 257/635 |

* cited by examiner

Primary Examiner—Michael S. Lebentritt
(74) Attorney, Agent, or Firm—Westerman, Hattori, Daniels & Adrian, LLP

(57) ABSTRACT

A first insulating film is formed on an underlying substrate, the first insulating film being made of a first insulating material. A second insulating film is formed on the first insulating film, the second insulating film being made of a second insulating material different from the first insulating material. A trench is formed through the second and first insulating film, the trench reaching at least an intermediate depth of the first insulating film. A wiring layer made of a conductive material is deposited on the second insulating film, the wiring layer burying the trench. The wiring layer is polished to leave the wiring layer in the trench. The wiring layer and second insulating film are polished until the first insulating film is exposed. Irregularity such as dishing and erosion can be suppressed from being formed.

12 Claims, 10 Drawing Sheets

US 6,686,285 B2

SEMICONDUCTOR DEVICE MANUFACTURE METHOD PREVENTING DISHING AND EROSION DURING CHEMICAL MECHANICAL POLISHING

CROSS REFERENCE TO RELATED APPLICATION

This application is based on Japanese Patent Application No. 2002-166621, filed on Jun. 7, 2002, the entire contents of which are incorporated herein by reference.

BACKGROUND OF THE INVENTION

A) Field of the Invention

The present invention relates to a wiring pattern forming method, and more particularly to a wiring pattern forming method of forming a trench through an insulating layer, depositing a conductive material on the insulating layer to bury the trench with the conductive material, and polishing the conductive material to leave a portion of the conductive material in the trench.

B) Description of the Related Art

A damascene method, which is compatible with both high speed and reliability, is used in the wiring pattern forming process for a high density semiconductor integrated circuit device. A dual damascene method is essential for the manufacture of sophisticated semiconductor integrated circuit devices, which method forms trenches and via holes for a wiring pattern thorough an interlayer insulating film, buries the trenches and via holes with copper and removes an unnecessary portion of the copper by chemical mechanical polishing.

With reference to FIGS. 5A to 5D, a wiring layer forming method using a conventional dual damascene method will be described.

As shown in FIG. 5A, a copper wiring layer 101 is disposed in the partial area of a surface layer of an underlying interlayer insulating film 100. On the interlayer insulating film 100 and wiring layer 101, a cap layer 102, a first interlayer insulating film 103, an etching stopper layer 104 and a second interlayer insulating film 105 are sequentially deposited. A wiring trench 106 is formed through the second interlayer insulating film 105 by an ordinary photolithography process. The etching stopper layer 104 is therefore exposed on the bottom of the wiring trench 106.

As shown in FIG. 5B, an opening is formed through the etching stopper layer 104 exposed on the bottom of the wiring trench 106 by using ordinary photolithography techniques. The first interlayer insulating film 103 is etched via the opening to form a via hole 107. The cap layer 102 exposed on the bottom of the via hole 107 is removed to expose the copper wiring layer 101.

A barrier metal layer is formed on the inner surfaces of the wiring trench 106 and via hole 107, and a copper seed layer is formed on the barrier metal layer. Copper is electroplated by using the seed layer as an electrode to form a copper layer 108. The copper layer 108 is filled in the wiring trench 106 and via hole 107.

As shown in FIG. 5C, the copper layer 108 is subjected to chemical mechanical polishing (CMP) to remove an unnecessary portion of the copper layer 108. The copper wiring layer 108 is therefore left in the wiring trench 106 and via hole 107.

As shown in FIG. 5D, on the second interlayer insulating film 105 and copper wiring layer 108, a cap layer 109 and a third interlayer insulating film 110 are formed. On this wiring layer 108, an upper level wiring layer is formed by a method similar to that used for forming the wiring layer 108.

As CMP of the copper wiring layer 108 is performed at the process shown in FIG. 5C, irregularity called dishing and erosion is formed on the surface of the substrate.

FIG. 6A shows the measurement results of irregularity on a substrate surface after CMP. The abscissa represents a scan distance along the substrate surface and one gradation corresponds to 80 $\mu$m. The ordinate represents a surface height and one gradation corresponds to 50 nm. Dishing D is formed at positions corresponding to the copper wiring pattern. Erosion E is formed in the area where copper wires are dense.

Dishing is formed because a polishing pad used for CMP deforms and the motion of the polishing pad follows the wiring pattern. Erosion is formed because a work pressure of CMP is concentrated upon an insulating film separating copper wires so that the insulating film and copper wires are polished excessively.

FIG. 6B shows the relation between a dishing depth and a wiring width. The abscissa represents a wiring width in the unit of "$\mu$m" and the ordinate represents a dishing depth in the unit of "nm". It can be seen that as the wiring width becomes broader, the dishing becomes deeper.

If dishing and erosion are formed, the surface of the third interlayer insulating film 110 shown in FIG. 5D has irregularity in conformity with the surface irregularity of the underlying layer. Irregularity formed on the surface of an interlayer insulating film may generate copper polishing residues as the copper layer buried in the wiring trench formed through the interlayer insulating film is polished. The copper polished residues may cause a short circuit of wiring lines. In order to prevent the generation of copper polishing residues, it is necessary to planarize the surface of an interlayer insulating film by CMP or the like after it is formed.

SUMMARY OF THE INVENTION

It is an object of the invention to provide a wiring pattern forming method capable of suppressing the formation of irregularity such as dishing and erosion.

According to one aspect of the present invention, there is provided a method of forming a wiring layer, comprising the steps of: (a) forming a first insulating film on an underlying substrate, the first insulating film comprising a first insulating material; (b) forming a second insulating film on the first insulating film, the second insulating film comprising a second insulating material different from the first insulating material; (c) forming a trench through the second and first insulating films, the trench reaching at least an intermediate depth of the first insulating film; (d) depositing a wiring layer comprising a conductive material on the second insulating film, the wiring layer burying the trench; (e) polishing the wiring layer to leave the wiring layer in the trench; and (f polishing the wiring layer and the second insulating film until the first insulating film is exposed.

By properly selecting the polishing conditions of the step (f, the formation of dishing and erosion can be suppressed.

As above, irregularity of a substrate surface after chemical mechanical polishing can be reduced.

DESCRIPTION OF THE PREFERRED EMBODIMENTS

Figure 1:
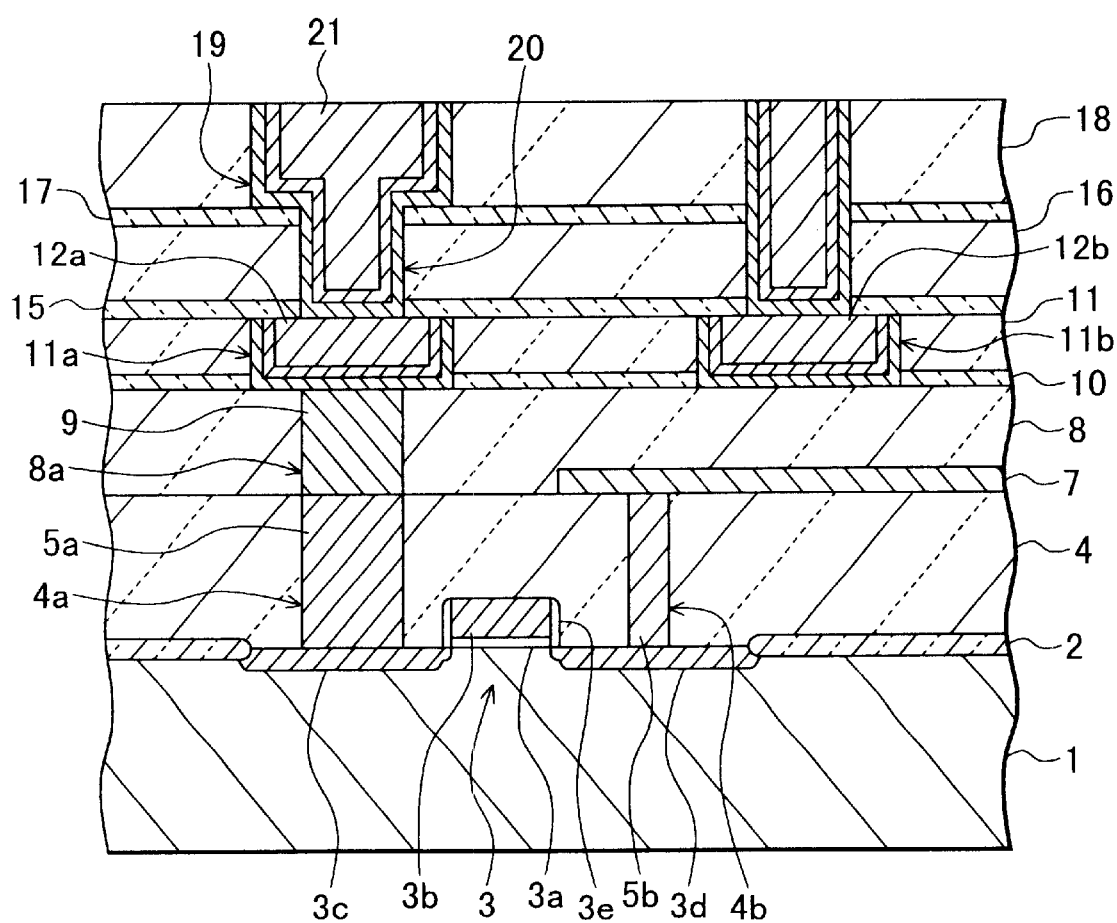
FIG. 1 is a cross sectional view of a semiconductor integrated circuit device manufactured by a wiring pattern forming method according to a first embodiment of the invention.

FIG. 1 is a cross sectional view of a semiconductor integrated circuit device manufactured by a wiring pattern forming method according to the first embodiment of the invention. A semiconductor substrate 1 made of p-type silicon has an element separation insulating film 2 formed in the surface layer of the substrate. The element separation insulating film 2 defines active regions. A MOS transistor 3 is formed in the active region. The MOS transistor 3 has a gate insulating film 3a, a gate electrode 3b and impurity diffusion regions 3c and 3d. One of the impurity diffusion regions 3c and 3d is a source region and the other is a drain region.

The impurity diffusion regions 3c and 3d formed in the surface layer on both sides of the gate electrode 3b have a lightly doped drain (LDD) structure. The gate electrode 3b has insulating side wall spacers 3e formed on the side walls of the gate electrode 3b. The side wall spacers 3e are used as the mask when ions are implanted into the high impurity concentration areas of the impurity diffusion regions 3c and 3d.

A first interlayer insulating film 4 made of silicon oxide ($SiO_2$) is formed on the semiconductor substrate 1, covering the MOS transistor 3. The first interlayer insulating film 4 has contact holes 4a and 4b formed therethrough at positions corresponding to the impurity diffusion regions 3c and 3d. Conductive plugs 5a and 5b are buried in the contact holes 4a and 4b. Each of the plugs 5a and 5b is constituted of a barrier metal layer made of titanium nitride (TiN) and covering the side and bottom walls of the plug and a tungsten member formed on the barrier metal layer.

A first wiring layer 7 made of aluminum is formed on the first interlayer insulating film 4. This wiring layer 7 is connected to the impurity diffusion region 3d of the MOS transistor 3 via the plug 5b.

A second interlayer insulating film 8 formed on the first interlayer insulating film 4 covers the first wiring layer 7. The second interlayer insulating film 8 is made of silicon oxide, borophosphosilicate glass (BPSG) or phosphosilicate glass (PSG). The second interlayer insulating film 8 has a contact hole 8a formed therethrough at the position corresponding to the plug 5a. A conductive plug 9 is buried in the contact hole 8a.

Formed on the second interlayer insulating film 8 are a cap layer 10 made of silicon nitride and a third interlayer insulating film 11 made of silicon oxide. The third interlayer insulating film 11 and cap layer 10 have wiring trenches 11a and 11b formed therethrough. Second layer wiring layers 12a and 12b are buried in the wiring trenches 11a and 11b.

Each of the wiring layers 12a and 12b has a three-layer structure including: a barrier metal layer covering the side and bottom walls of a corresponding one of the wiring trenches 11a and 11b; a seed layer covering the barrier metal layer; and a main wiring member filled in the wiring trench and covering the seed layer. The barrier metal layer is made of tantalum (Ta), tantalum nitride (TaN), titanium nitride (TiN) or the like. The barrier metal layer may have a lamination structure of a Ta layer and a TaN layer. The seed layer and main wiring member are made of copper or alloy mainly containing copper.

A cap layer 15, a fourth interlayer insulating film 16, an etching stopper layer 17 and a fifth interlayer insulating film 18 are formed in this order on the wiring layers 12a and 12b and third interlayer insulating film 11. The etching stopper layers 15 and 17 are made of silicon carbide (SiC). The fourth and fifth interlayer insulating films 16 and 18 are made of SiOC.

The fifth interlayer insulating film 18 has a wiring trench 19 reaching the etching stopper layer 17. A via hole 20 is formed extending from the etching stopper layer 17 on the bottom of the wiring trench 19 to the upper surface of the wiring layer 12a.

A third layer wiring layer 21 is buried in the wiring trench 19 and via hole 20. The third layer wiring layer 21 is constituted of: a barrier metal layer covering the side and bottom walls of the wiring trench 10 and via hole; a seed layer covering the barrier metal layer; and a main wiring member filled in the wiring trench 19 and via hole 10 and covering the seed layer. The materials of the barrier metal layer, seed layer and main wiring member are similar to those of the second layer wiring layer 12a.

Next, with reference to FIGS. 2A to 2G, the wiring pattern forming method of the first embodiment will be described by taking as an example the method of forming the third layer wiring layer 21 shown in FIG. 1. FIGS. 2A to 2G show only the cap layer 15 shown in FIG. 1 and layers at higher levels.

Figure 2A:
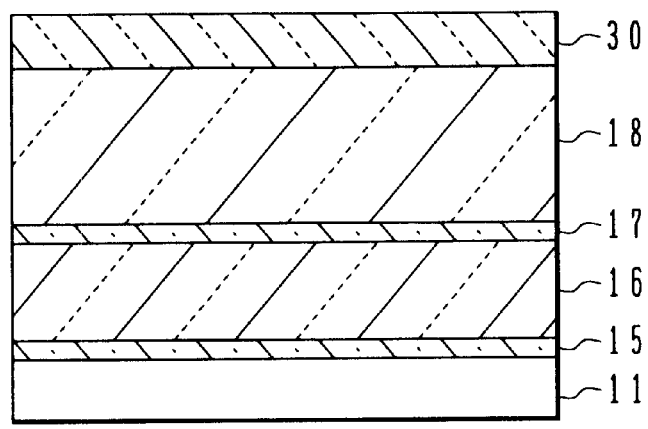
FIGS. 2A to 2G are cross sectional views of a wiring pattern illustrating the wiring pattern forming method of the first embodiment.

As shown in FIG. 2A, on the third interlayer insulating film 11, the cap layer 15 of SiC having a thickness of 50 nm, the fourth interlayer insulating film 16 of SiOC having a thickness of 600 nm, the etching stopper layer 17 of SiC having a thickness of 50 nm, the fifth interlayer insulating film 18 of SiOC having a thickness of 400 nm, and a sacrificial film 30 of $SiO_2$ having a thickness of 100 nm are sequentially formed. These layers and films can be formed by plasma enhanced chemical vapor deposition (PE-CVD). The SiC film and SiOC film may be made of materials under the product names SiC or CORAL of Novellus Systems, Inc., or BLOCK or BlackDiamond of Applied Materials, Inc.

If necessary, an antireflection film of SiON, SiN or the like may be formed on the sacrificial film 30.

Figure 2B:
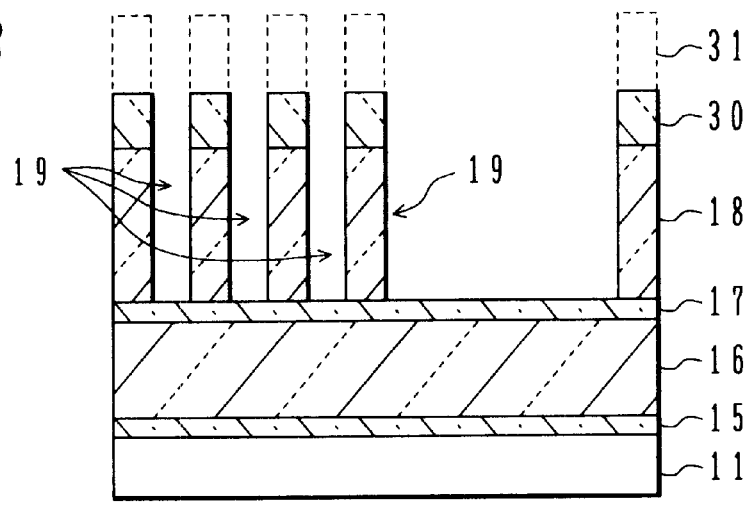

As shown in FIG. 2B, the surface of the sacrificial film 30 is covered with a resist film 31 and openings corresponding to a wiring pattern are formed through the resist film 31. By using the resist film 31 as a mask, the sacrificial film 30 and fifth interlayer insulating film 18 are dry-etched to form wiring trenches 19. For example, etching gas may be mixed gas of $CF_4$ and $CH_2F_2$, $C_4F_6$ gas or the like. Etching stops when the etching stopper layer 17 is exposed. After the wiring trenches 19 are formed, the resist film 31 is removed.

Figure 2C:
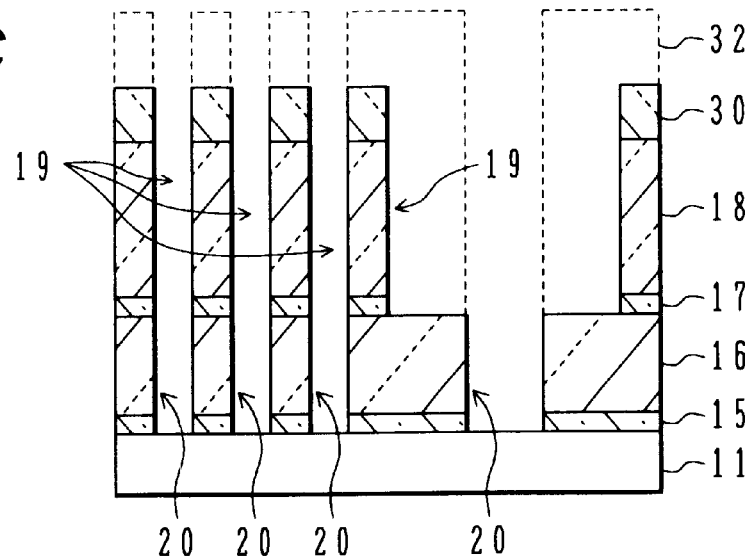

As shown in FIG. 2C, the upper surface of the sacrificial film 30 and the inner surfaces of the wiring trenches 19 are covered with a resist film 32. Openings corresponding to via holes to be formed are formed through the resist film 32. By using the resist film 32 as a mask, the etching stopper layer 17 and fourth interlayer insulating film 16 are etched. For example, the etching stopper layer 17 is dry-etched by using mixed gas of $CF_4$ and $CH_2F_2$, and the fourth interlayer insulating film 16 is dry-etched by using $C_4F_6$ gas. Via holes 20 are therefore formed and the cap layer 15 is exposed on the bottom surfaces of the via holes 20. After the fourth interlayer insulating film 16 is etched, the resist film 32 is removed.

The cap layer 15 exposed on the bottom surfaces of the via holes 20 is removed to expose underlying copper wiring layers. For example, the cap layer 15 is dry-etched by using $CHF_3$ gas. At this time, the etching stopper layer 17 exposed on the bottom surfaces of the wiring trenches 19 is removed.

Figure 2D:
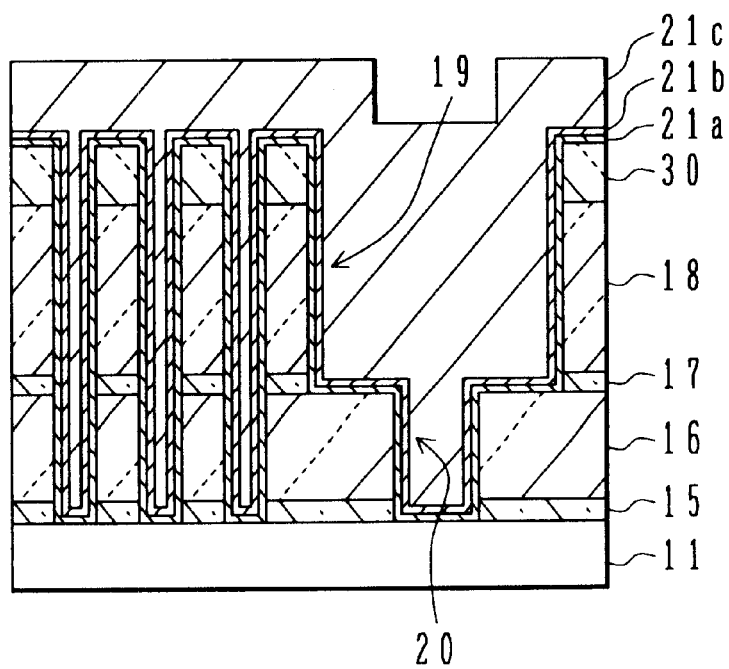

As shown in FIG. 2D, the inner surfaces of the wiring trenches 19 and via holes 20 and the upper surface of the sacrificial film 30 are covered with a barrier metal layer 21a of tantalum having a thickness of 10 nm. The material of the barrier metal layer 21 a may be tantalum nitride (TaN), titanium nitride (TiN) or the like. On the surface of the barrier metal layer 21a, a seed layer 21b of copper (Cu) having a thickness of 150 nm is formed. The barrier metal layer 21a and seed layer 21b are formed by sputtering. Next, copper is electroplated to form a copper layer 21c. The copper layer 21c has a thickness sufficient for being filled in the wiring trenches 19 and via holes 20.

Figure 2E:
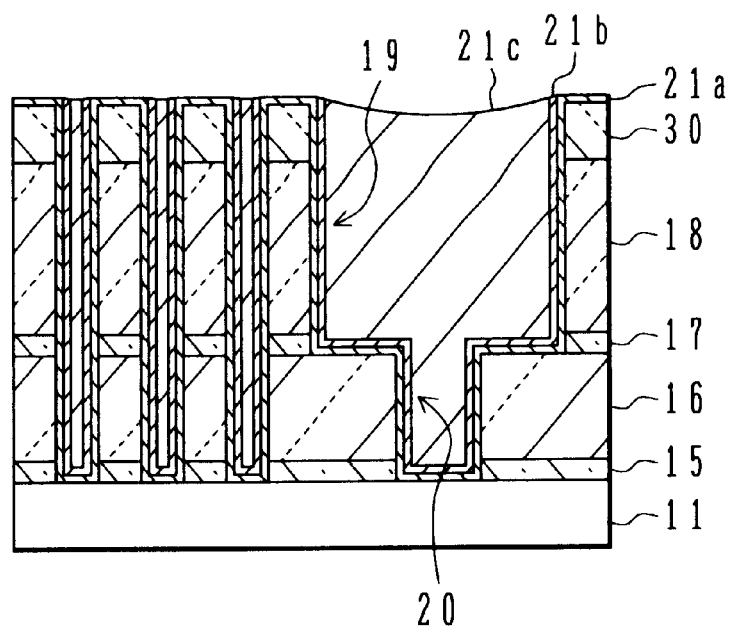

As shown in FIG. 2E, the copper layer 21c is subjected to chemical mechanical polishing by using the polishing liquid with which the polishing speed of copper becomes faster than that of tantalum or silicon oxide. The polishing liquid to be used contains, for example, abrasive grains of silica or the like, organic substance forming complex with copper, copper anticorrosion agent, oxidant and the like. Since the polishing speed of tantalum and silicon oxide is relatively slow, polishing can be stopped with high reproductivity when the barrier metal layer 21a of Ta or the sacrificial film 30 of $SiO_2$ is exposed.

Since the polishing speed of copper is relatively fast, dishing is formed on the surface of the copper wiring layer 21c left in the wiring trench 19. It is preferable to make the sacrificial film 30 thick in order to make the deepest position of the dishing becomes higher than the bottom of the sacrificial film 30.

Figure 2F:
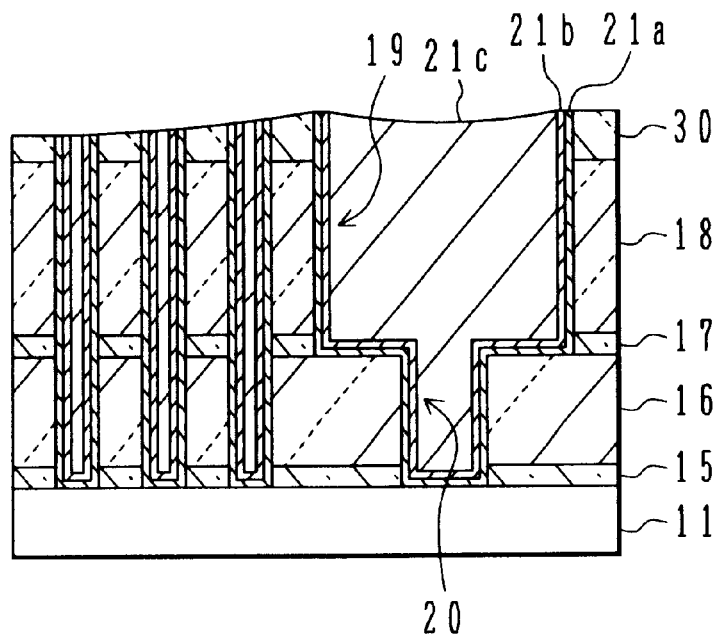

As shown in FIG. 2F, the sacrificial film 30, copper layer 21c, seed layer 21b and barrier metal layer 21a are subjected to chemical mechanical polishing by using the polishing liquid with which the polishing speed of tantalum or silicon oxide becomes faster than that of copper. The polishing liquid to be used may contain, for example, abrasive grains of silica or the like, organic acid, copper anticorrosion agent.

As polishing the barrier metal layer 21b of tantalum and the sacrificial film 30 of $SiO_2$ advances, the dishing on the surface of the copper layer 21c shown in FIG. 2E is planarized. As polishing advances further, the exposed surface of the copper layer 21c protrudes. Since a polishing pressure is concentrated upon this protruded region, the surface of the copper layer 21c is eventually planarized.

Figure 2G:
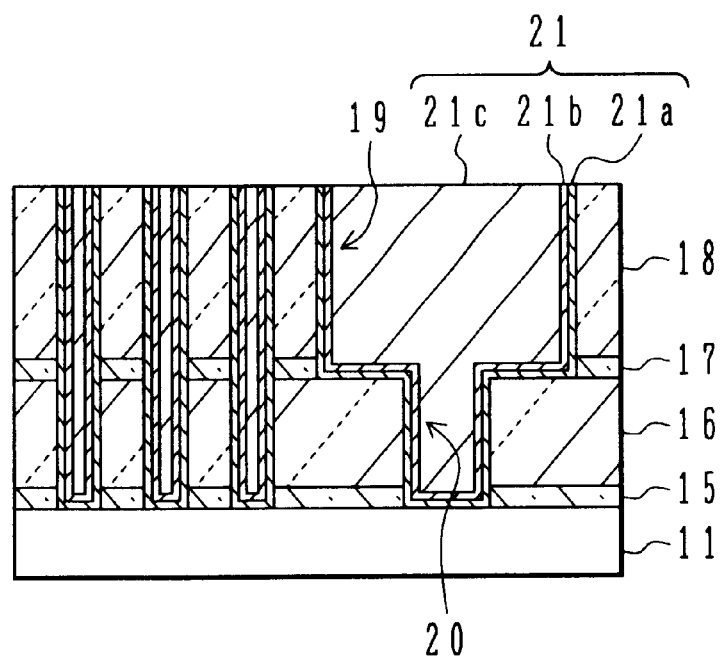

As shown in FIG. 2G, when the fifth interlayer insulating film 18 made of hydrophobic SiOC is exposed, polishing can be stopped with high reproductivity because the fifth interlayer insulating film 18 functions as a polishing stopper layer. Under the polishing conditions of a relatively low polishing speed of copper, dishing is hard to be formed on the surface of the copper layer 21c. The formation of erosion can also be prevented.

Figure 3A:
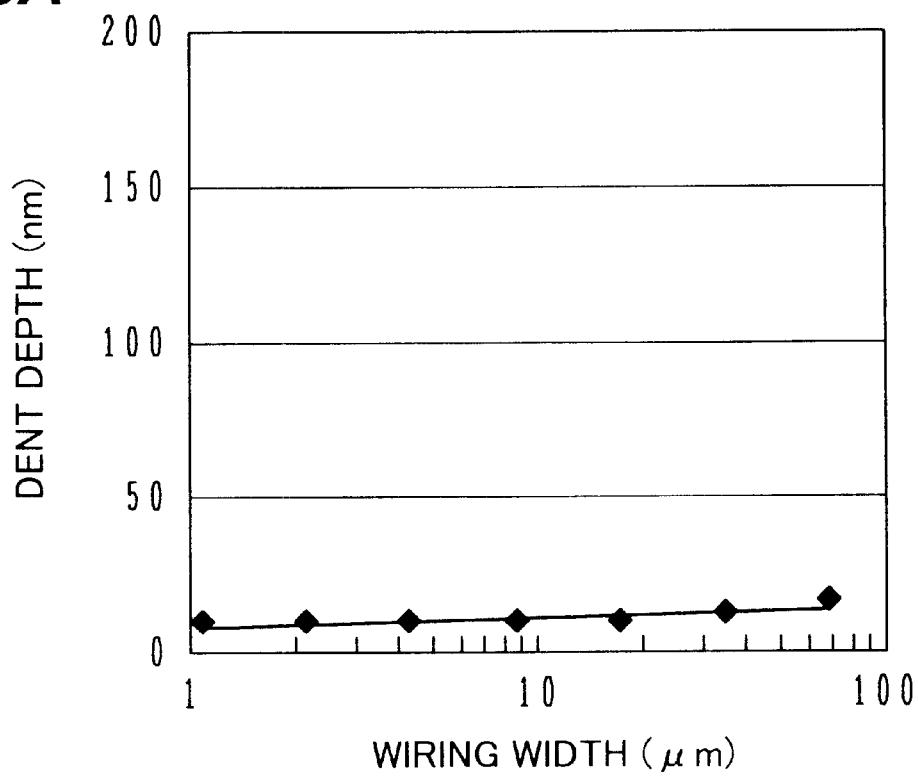
FIGS. 3A and 3B are graphs showing the relation between a dishing depth and a wiring width after chemical mechanical polishing.
Figure 3B:
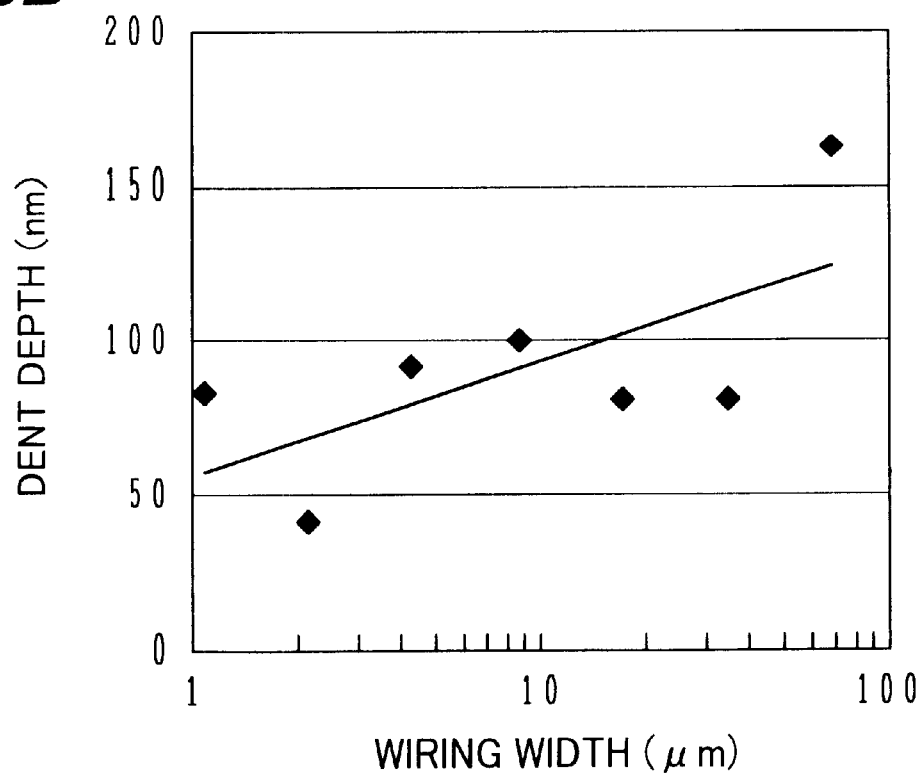

FIGS. 3A and 3B are graphs showing the relation between a depth of a dent formed on a substrate surface and a wiring width. FIG. 3A shows dent depths when the wiring pattern forming method of the first embodiment is used, and FIG. 3B shows dent depths when the conventional wiring pattern forming method is used. The abscissa represents a wiring width in the unit of "μm" and the ordinate represents a dent depth from a virtual flat surface in the unit of "nm". The area of a wiring pattern was 80% of the whole substrate surface.

It can be seen from the comparison between FIGS. 3A and 3B that the dent is shallow when the wiring pattern forming method of the first embodiment is used. By adopting the wiring pattern forming method of the first embodiment, the substrate surface after CMP can be planarized sufficiently.

In the first embodiment, the fourth and fifth interlayer insulating films 16 and 18 are made of SiOC having a dielectric constant lower than $SiO_2$. A parasitic capacitance between wiring lines can therefore be reduced.

A thin cap layer of SiC may be disposed between the fifth interlayer insulating film 18 and sacrificial film 30 shown in FIG. 2A. For example, the thickness of the cap layer is about 30 to 50 nm. In the state after CMP shown in FIG. 2G, the thin cap layer of SiC is left on the surface of the fifth interlayer insulating film 18. Scratches are hard to be formed during CMP.

The fifth interlayer insulating film 18 may be made of insulating material which contains Si, O, C and H.

Next, with reference to FIGS. 4A to 4G, a wiring pattern forming method according to the second embodiment will be described. A substrate formed with the layers up to the third interlayer insulating film 11 shown in FIG. 1 is prepared. A method of forming the wiring layers at levels higher than the third interlayer insulating film 11 will be described.

Figure 4A:
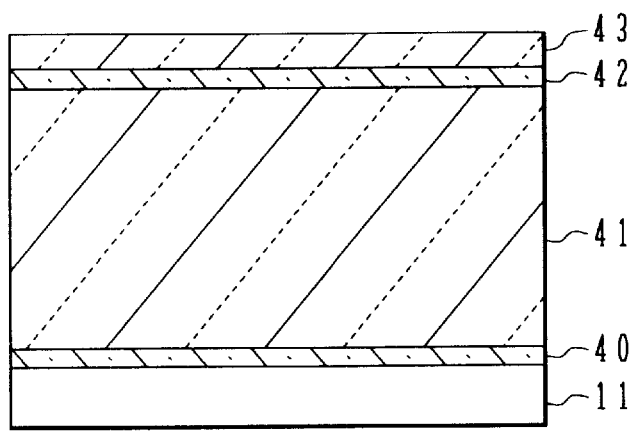
FIGS. 4A to 4G are cross sectional views of a wiring pattern illustrating a wiring pattern forming method according to a second embodiment of the invention.

As shown in FIG. 4A, on the surface of the third interlayer insulating film 11, a cap layer 40 of SiC having a thickness of 50 nm, a sixth interlayer insulating film 41 of low dielectric constant organic insulating material, e.g., SiLK of Dow Chemical Company having a thickness of 400 nm, a cap layer 42 of SiC having a thickness of 50 nm and a sacrificial film 43 of $SiO_2$ having a thickness of 100 nm are sequentially formed. The cap layers 40 and 42 and sacrificial film 43 are formed by PE-CVD. The sixth interlayer insulating film 41 is formed by coating.

Figure 4B:
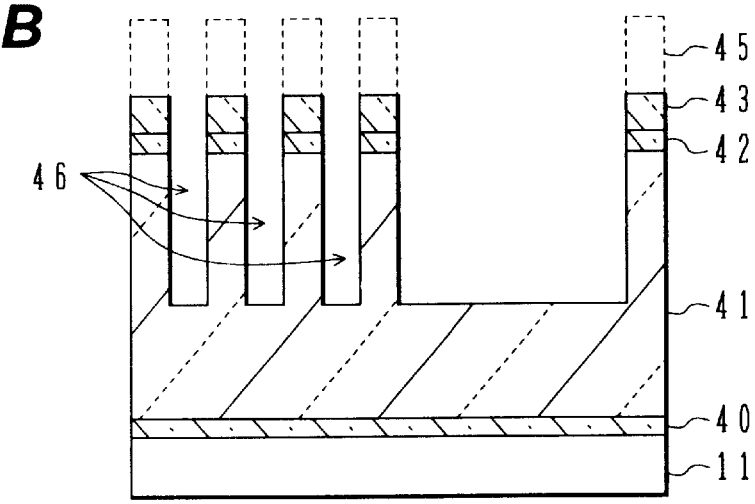

As shown in FIG. 4B, a resist film 45 is coated on the surface of the sacrificial film 43, and openings corresponding to a wiring pattern are formed through the resist film 45 by ordinary photolithography. By using the resist film 45 as a mask, the sacrificial film 43, cap layer 42 and sixth interlayer insulating film 41 are etched to the intermediate depth of the sixth interlayer insulating film 41 to form wiring trenches 46. For example, the sacrificial film 43, cap layer 42 and sixth interlayer insulating film 41 are dry-etched by using $C_4F_6$-containing gas or $CHF_3$-containing gas. After the wiring trenches 46 are formed, the resist film 45 is removed.

Figure 4C:
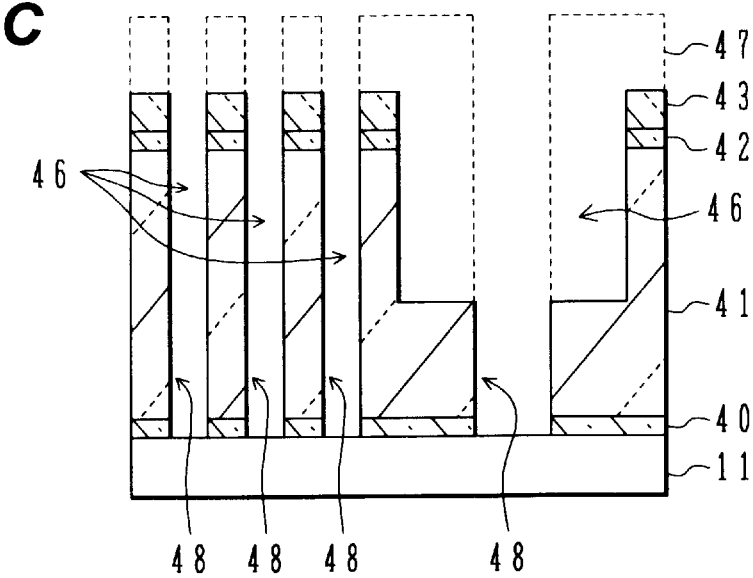

As shown in FIG. 4C, the upper surface of the sacrificial film 45 and the inner surfaces of the wiring trenches 46 are covered with a resist film 47, and openings corresponding to via holes to be formed are formed through the resist film 47. By using the resist film 47 as a mask, the sixth interlayer insulating film 41 is etched. For example, the sixth interlayer insulating film 41 is dry-etched by using mixed gas of $NH_3$ and $H_2$. Via holes 48 are therefore formed and the cap layer 40 is exposed on the bottoms of the via holes. After the sixth interlayer insulating film 41 is etched, the resist film 47 is removed.

The cap layer 40 exposed on the bottoms of the via holes 48 is removed to expose underlying copper wiring layers. For example, the cap layer 40 is dry-etched by using $CH_2F_2$-containing gas.

Figure 4D:
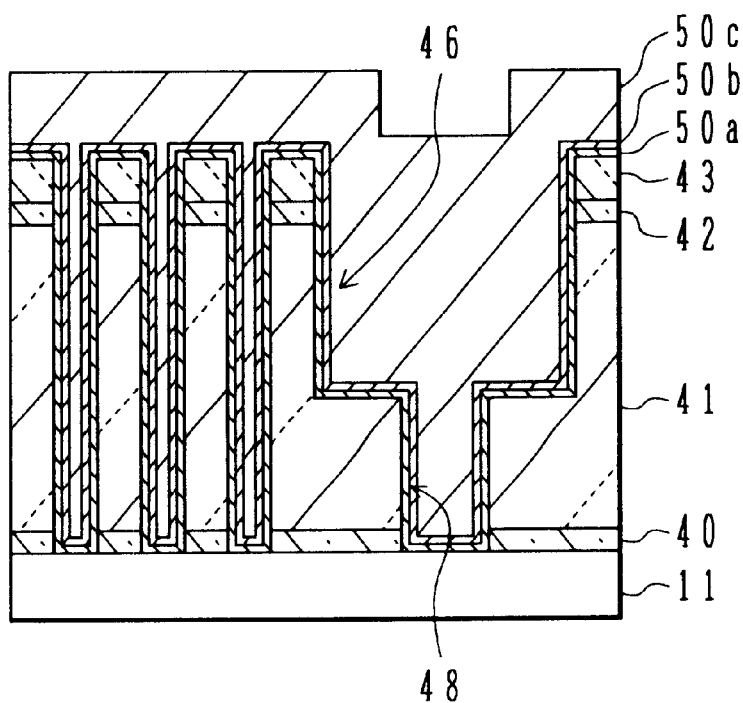

As shown in FIG. 4D, the inner surfaces of the wiring trenches 46 and via holes 48 and the surface of the sacrificial film 43 are covered with a barrier metal layer 50a made of tantalum (Ta) having a thickness of 10 nm. On the surface of the barrier metal layer 50a, a seed layer 50b of copper (Cu) having a thickness of 150 nm is formed. Next, copper is electroplated to form a copper layer 50c.

Figure 4E:
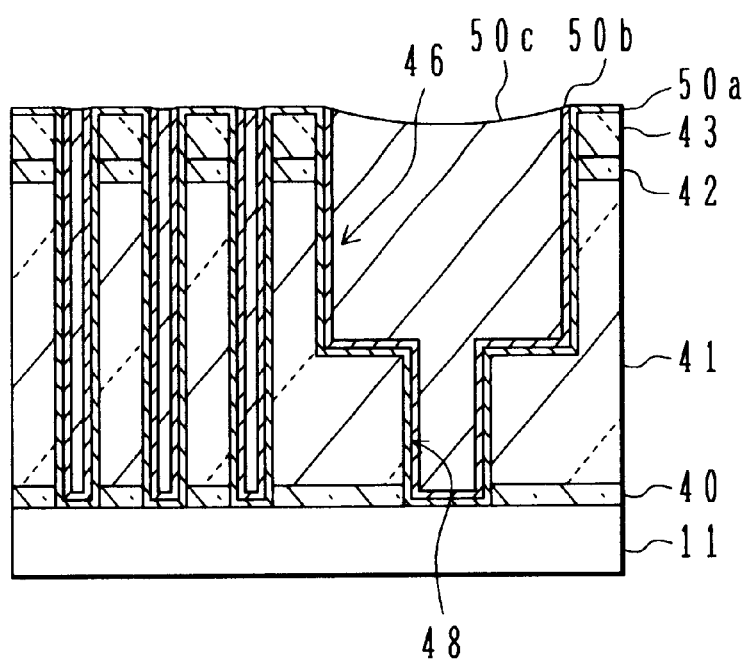

As shown in FIG. 4E, the copper layer 50c is subjected to chemical mechanical polishing by using the polishing liquid with which the polishing speed of copper becomes faster than that of tantalum or silicon oxide. Since the polishing speed of tantalum and silicon oxide is relatively slow, polishing can be stopped with high reproductivity when the barrier metal layer 50a of tantalum or the sacrificial film 43 of $SiO_2$ is exposed.

Since the polishing speed of copper is relatively fast, dishing is formed on the surface of the copper wiring layer 50c left in the wiring trench 46. It is preferable to make the sacrificial film 43 thick in order to make the deepest position of the dishing becomes higher than the bottom of the sacrificial film 43.

Figure 4F:
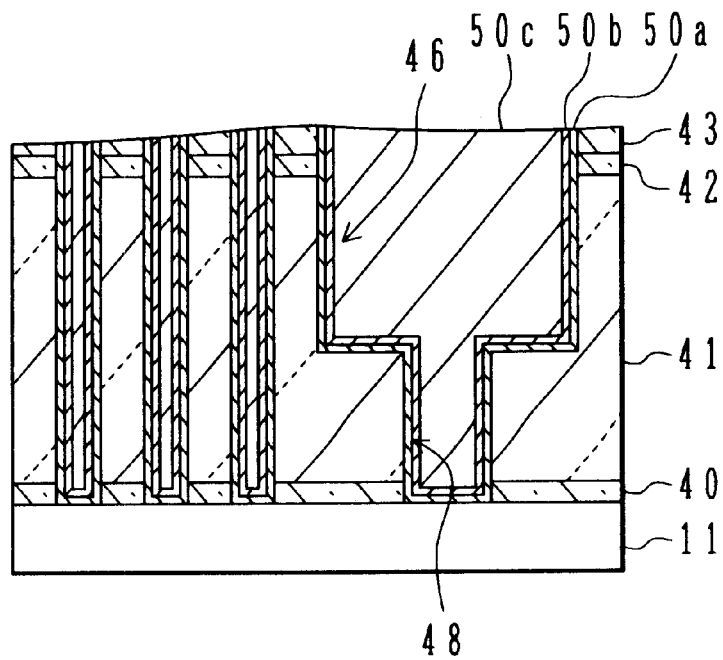

As shown in FIG. 4F, the sacrificial film 43, copper layer 50c, seed layer 50b and barrier metal layer 50a are subjected to chemical mechanical polishing by using the polishing liquid with which the polishing speed of tantalum or silicon oxide becomes faster than that of copper.

As polishing the barrier metal layer 50b of tantalum and the sacrificial film 43 of $SiO_2$ advances, the dishing on the surface of the copper layer 50c shown in FIG. 4E is planarized. As polishing advances further, the exposed surface of the copper layer 50c protrudes. Since a polishing pressure is concentrated upon this protruded region, the surface of the copper layer 50c is eventually planarized.

Figure 4G:
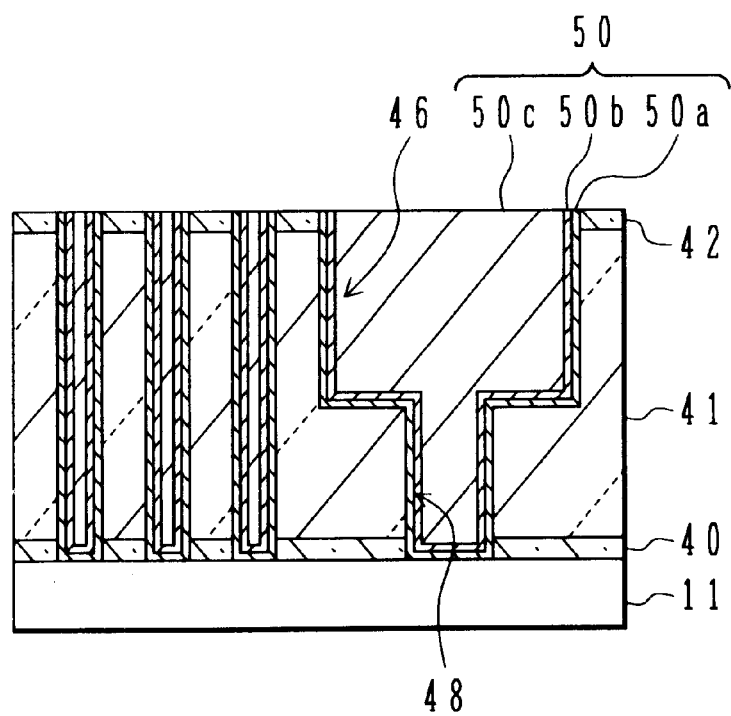
Figure 5A:
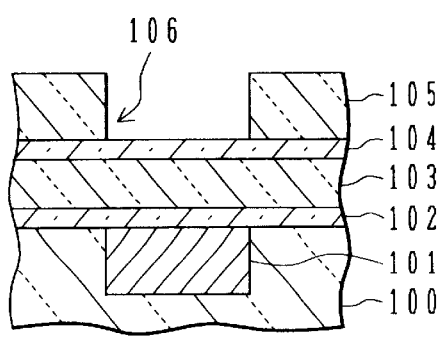
FIGS. 5A to 5D are cross sectional views of wiring layers illustrating a wiring layer forming method adopting a conventional dual damascene method.
Figure 5C:
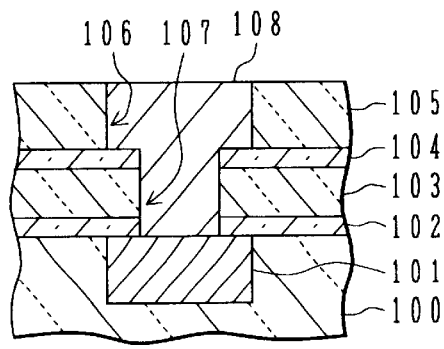
Figure 5B:
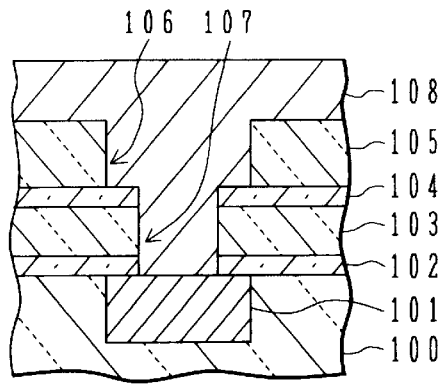
Figure 5D:
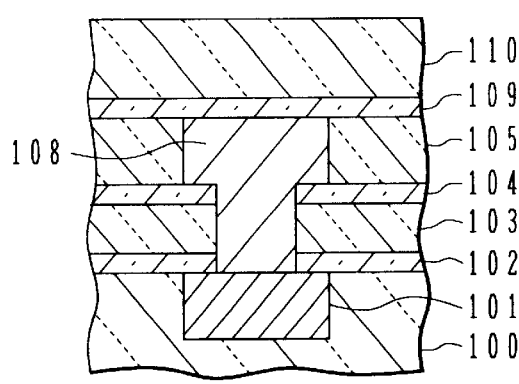
Figure 6A:
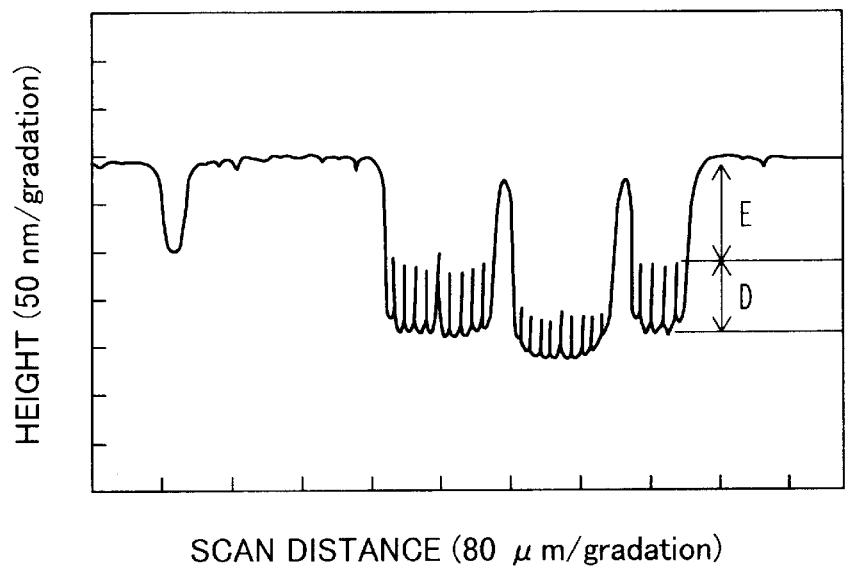
FIG. 6A is a graph showing irregularity on a substrate surface after chemical mechanical polishing.
Figure 6B:
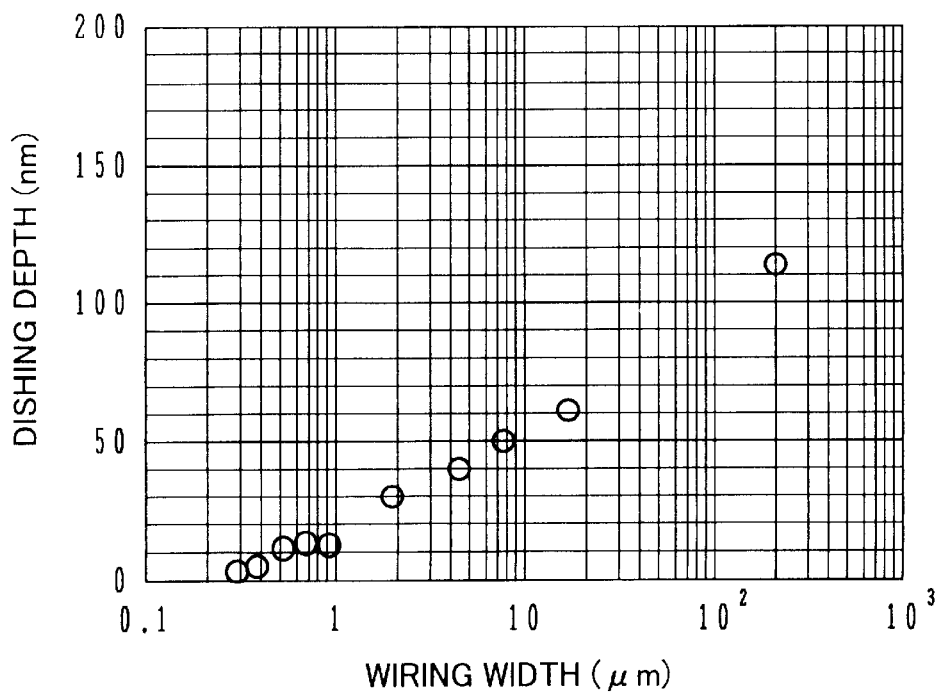
FIG. 6B is a graph showing the relation between a dishing depth and a wiring width.

As shown in FIG. 4G, when the cap layer 42 made of hydrophobic SiOC is exposed, polishing can be stopped with high reproductivity because the cap layer 42 functions as a polishing stopper layer. In the wiring trenches 46 and via holes 48, a copper wiring layer 50 is left which is constituted of the barrier metal layer 50a, seed layer 50b and copper layer 50c. Under the polishing conditions of a relatively low polishing speed of copper, dishing is hard to be formed on the surface of the copper layer 50c. The formation of erosion can also be prevented.

In the second embodiment, although the cap layer 42 is made of SiC, SiOC may also be used which is hydrophobic similar to SiC. The cap layer 42 may have a two-layer structure of an SiOC layer and an SiC layer. From the viewpoint of a dielectric constant, it is effective that the cap layer 42 is made of SiOC. However, if the SiOC layer is exposed during CMP, scratches are likely to be formed. Since the SiC layer is formed on the SiOC layer, it is possible to prevent the formation of scratches.

Also in the second embodiment, SiLK (trade mark of Dow Chemical Company) is used as the low dielectric constant organic material of the sixth interlayer insulating film 41. Other materials may also be used such as polytetrafluoroethylene (PTFE), FLARE (trade mark of Honeywell Inc.), benzocyclobutene (BCB), methylsilsesquioxane (MSQ) (e.g. LKD of JSR Corporation) and the like. The material of the sixth interlayer insulating film 41 may be low dielectric constant porous insulating material instead of organic insulating material.

The present invention has been described in connection with the preferred embodiments. The invention is not limited only to the above embodiments. It is apparent that various modifications, improvements, combinations, and the like can be made by those skilled in the art.

We claim:

1. A method of manufacturing a semiconductor device, comprising the steps of:
    (a) forming a first insulating film on an underlying substrate, the first insulating film comprising a first insulating material;
    (b) forming a second insulating film on the first insulating film, the second insulating film comprising a second insulating material different from the first insulating material;
    (c) forming a trench through the second and first insulating films, the trench reaching at least an intermediate depth of the first insulating film;
    (d) depositing a wiring layer comprising a conductive material on the second insulating film, the wiring layer burying the trench;
    (e) polishing the wiring layer to leave the wiring layer in the trench; and
    (f) polishing the wiring layer and the second insulating film until the first insulating film is exposed.

2. A method according to claim 1, wherein said step (e) polishes the wiring layer under a condition that a polishing speed of the wiring layer is faster than a polishing speed of the second insulating film.

3. A method according to claim 1, wherein said step (f) polishes the wiring layer and the second insulating film until the first insulating film is exposed, under a condition that a polishing speed of the second insulating film is faster than a polishing speed of the wiring layer.

4. A method according to claim 1, wherein said step (e) stops polishing in a state that a deepest position of dishing formed on a surface of the wiring layer is higher than a bottom of the second insulating film.

5. A method according to claim 1, wherein a surface of the first insulating film is hydrophobic.

6. A method according to claim 1, wherein said step (d) includes a step of depositing a barrier metal layer for preventing diffusion of the conductive material of the wiring layer before the wiring layer is deposited, and the wiring layer is deposited on the barrier metal layer.

7. A method according to claim 6, wherein said step (e) polishes the wiring layer until the barrier metal layer or the second insulating film is exposed.

8. A method according to claim 1, wherein:
    said step (a) includes a step of forming a third insulating film on the underlying substrate before the first insulating film is formed, the third insulating film comprising an organic insulating material or a porous insulating material having a dielectric constant smaller than a dielectric constant of the first insulating film; and
    said step (c) forms the trench reaching at least an intermediate depth of the third insulating film.

9. A method according to claim 1, wherein the first insulating film comprising a material selected from a group consisting of SiC, SiOC and SiOCH.

10. A method according to claim 1, wherein the second insulating film comprising silicon oxide.

11. A method according to claim 1, wherein the wiring layer comprising copper or alloy mainly containing copper.

12. A method of forming a wiring layer, comprising the steps of:

(a) forming a first insulating film on an underlying substrate, the first insulating film comprising a first insulating material;

(b) forming a second insulating film on the first insulating film, the second insulating film comprising a second insulating material different from the first insulating material;

(c) forming a trench through the second and first insulating films, the trench reaching at least an intermediate depth of the first insulating film;

(d) depositing a wiring layer comprising a conductive material on the second insulating film, the wiring layer burying the trench;

(e) polishing the wiring layer to leave the wiring layer in the trench; and (f) polishing the wiring layer and the second insulating film until the first insulating film is exposed.

* * * * *